US010050069B2

(12) United States Patent
Yamamura et al.

(10) Patent No.: US 10,050,069 B2
(45) Date of Patent: Aug. 14, 2018

(54) PHOTODIODE ARRAY

(71) Applicant: HAMAMATSU PHOTONICS K.K., Hamamatsu-shi, Shizuoka (JP)

(72) Inventors: Kazuhisa Yamamura, Hamamatsu (JP); Kenichi Sato, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/293,784

(22) Filed: Oct. 14, 2016

(65) Prior Publication Data

US 2017/0033137 A1 Feb. 2, 2017

Related U.S. Application Data

(60) Continuation of application No. 13/774,002, filed on Feb. 22, 2013, now Pat. No. 9,484,366, which is a (Continued)

(30) Foreign Application Priority Data

Jul. 3, 2006 (JP) ............................. P2006-183598

(51) Int. Cl.
*H01L 31/107* (2006.01)
*H01L 27/144* (2006.01)
(Continued)

(52) U.S. Cl.
CPC .......... *H01L 27/1446* (2013.01); *H01L 27/14* (2013.01); *H01L 27/14605* (2013.01);
(Continued)

(58) Field of Classification Search
CPC ................. H01L 27/14; H01L 27/1446; H01L 27/14603; H01L 27/14636; H01L 31/107
(Continued)

(56) References Cited

U.S. PATENT DOCUMENTS 5,719,414 A * 2/1998 Sato ...................... H01L 31/105
257/186
6,538,299 B1 3/2003 Kwark et al.
(Continued)

FOREIGN PATENT DOCUMENTS

EP 2 013 916 1/2009
JP 61-114548 6/1986
(Continued)

OTHER PUBLICATIONS

P. Buzhan et al., "An Advanced Study of Silicon Photomultiplier," [online], ICFA Instrumentation Bulletin, Fall 2001 Issue, vol. 23, [retrieval date Jul. 18, 2007], http://www.slac.stanford.edu/pubs/icfa.
(Continued)

*Primary Examiner* — Tan N Tran
(74) *Attorney, Agent, or Firm* — Drinker Biddle & Reath LLP

(57) ABSTRACT

A photodiode array has a plurality of photodetector channels formed on an n-type substrate having an n-type semiconductor layer, with a light to be detected being incident to the photodetector channels. The array comprises: a p⁻-type semiconductor layer on the n-type semiconductor layer of the substrate; resistors is provided to each of the photodetector channels and is connected to a signal conductor at one end thereof; and an n-type separating part between the plurality of photodetector channels. The p⁻-type semiconductor layer forms a pn junction at the interface between the substrate, and comprises a plurality of multiplication regions for avalanche multiplication of carriers produced by the incidence of the light to be detected so that each of the multiplication regions corresponds to each of the photodetector channels.

2 Claims, 15 Drawing Sheets

Related U.S. Application Data continuation of application No. 13/116,525, filed on May 26, 2011, now Pat. No. 8,610,231, which is a division of application No. 12/306,963, filed as application No. PCT/JP2007/063299 on Jul. 3, 2007, now Pat. No. 8,008,741.

(51) Int. Cl.
*H01L 27/14* (2006.01)
*H01L 27/146* (2006.01)

(52) U.S. Cl.
CPC ...... *H01L 27/14636* (2013.01); *H01L 31/107* (2013.01); *H01L 27/14603* (2013.01)

(58) Field of Classification Search
USPC ................. 257/438, 448, E27.129, E31.116
See application file for complete search history.

(56) References Cited

U.S. PATENT DOCUMENTS

| | | | |
|---|---|---|---|
| 6,791,124 B2 | 9/2004 | Hiraoka et al. | |
| 2006/0175529 A1 | 8/2006 | Harmon et al. | |
| 2007/0090394 A1 | 4/2007 | Bui et al. | |
| 2008/0150069 A1* | 6/2008 | Popovic | H01L 31/101 257/443 |
| 2009/0008566 A1 | 1/2009 | Agarwal et al. | |
| 2009/0121306 A1* | 5/2009 | Ishikawa | H01L 27/1446 257/438 |

FOREIGN PATENT DOCUMENTS

| | | |
|---|---|---|
| JP | H3-127866 | 5/1991 |
| JP | H5-102512 | 4/1993 |
| JP | 7-183568 | 7/1995 |
| JP | 7-221341 | 8/1995 |
| JP | 9-148618 | 6/1997 |
| JP | 11-46010 | 2/1999 |
| JP | 2001-244494 | 9/2001 |
| JP | 2001-352094 | 12/2001 |
| JP | 2004-512686 | 4/2004 |
| JP | 2005-45125 | 2/2005 |
| JP | 2005-517300 | 6/2005 |
| JP | 2005-198239 | 7/2005 |
| JP | 2005-532695 | 10/2005 |
| TW | 200418206 | 9/2004 |
| TW | 200623472 | 7/2006 |
| WO | WO 03/003476 | 1/2003 |
| WO | WO 2005/048319 | 5/2005 |
| WO | WO 2005/106971 | 11/2005 |
| WO | WO 2006/010615 | 2/2006 |
| WO | 2006/068184 | 6/2006 |
| WO | WO 2007/127607 | 11/2007 |

OTHER PUBLICATIONS

P. Buzhan et al., "Silicon Photomultiplier and Its Possible Applications," Nuclear Instruments & Methods in Physics Research A 504, 2003, pp. 48-52.

A.N. Otte et al., "A test of silicon photomultipliers as readout for PET," Nuclear Instruments and Methods in Physics Research Section A, vol. 545, No. 3, Jun. 21, 2005, pp. 705-715.

A. Nepomuk Otte et al., "New results from a test of silicon photomultiplier as readout for PET," IEEE Nuclear Science Symposium Conference, vol. 6, Oct. 16, 2004, pp. 3738-3742.

E. Sciacca et al., "Silicon planar technology for single-photon optical detectors," IEEE Transactions on Electron Devices, vol. 50, No. 4, Apr. 1, 2003, pp. 918-925.

S. Cova et al., "Avalanche photodiodes and quenching circuits for single-photon detection," Applied Optics, vol. 35, No. 12, Apr. 20, 1996, pp. 1956-1976.

* cited by examiner

PHOTODIODE ARRAY

This is a continuation application of copending application Ser. No. 13/774,002, having a filing date of Feb. 22, 2013, which is a continuation of prior application Ser. No. 13/116,525, having a filing date of May 26, 2011, which issued as U.S. Pat. No. 8,610,231 on Dec. 17, 2013, which is a divisional of prior application Ser. No. 12/306,963 having a § 371 date of Feb. 20, 2009, which issued as U.S. Pat. No. 8,008,741 on Aug. 30, 2011 which is a national stage filing based on PCT International Application No. PCT/JP2007/063299, filed on Jul. 3, 2007. The copending and prior application Ser. Nos. 13/774,002, 13/116,525, and 12/306,963 are incorporated by reference herein in their entireties.

TECHNICAL FIELD

The present invention relates to a photodiode array.

BACKGROUND ART

In the fields of chemistry and medical care for example, there has been a technology for photon counting which uses a scintillator coupled with a photodiode array based on avalanche (electron avalanche) multiplication phenomenon. Such a photodiode array has divided photodetector channels formed on a common substrate in order to discriminate a plurality of photons which simultaneously enter thereto, and each of the photodetector channels is provided with multiplication regions (for example, see Non-Patent Documents 1 and 2, and Patent Document 1).

Each multiplication region which is very sensitive to faint light is caused to be operated under an operation condition, called Geiger mode. That is, each multiplication region is applied with a reverse voltage that exceeds a breakdown voltage, and then the phenomenon is used in which carriers generated by the incident photons are multiplied in an avalanche process. Each photodetector channel is connected with a resistor for deriving an output signal from the multiplication region, and the resistors are connected with each other in parallel. The photons incident to each photodetector channel are detected based on the peak value of the output signal which was derived outside through each resistor.

[Patent Document 1] Japanese Patent Application Laid-Open No. 11-46010
[Non-Patent Document 1] P. Buzhan, et al., "An Advanced Study of Silicon Photomultiplier" [online], ICFA Instrumentation BULLETIN Fall 2001 Issue, [searched on 4 Nov. 2004], <URL: http://www.slac.stanford.edu/pubs/icfa>
[Non-Patent Document 2] P. Buzhan, et al., "Silicon Photomultiplier And Its Possible applications", Nuclear Instruments and Methods in Physics Research A 504 (2003) 48-52

DISCLOSURE OF THE INVENTION

When a photodiode array is used for photon counting, in order to obtain satisfactory result, it is important to increase detection efficiency by increasing the ratio of opening area to a light to be detected.

However, for example, in the reach-through photodiode arrays described in Non-Patent Documents 1 and 2, the pn junction of each photodiode is attained using a semiconductor layer which is formed on the surface of each photodetector channel. As a result, the semiconductor layer of the each semiconductor layer for attaining a pn junction is required to have guard ring at its outer periphery edge portion to prevent edge breakdown, which limits any increase of the ratio of opening area to a light to be detected. In such a photodiode array having a low ratio of opening area, the detection sensitivity is hardly improved. In addition, the avalanche multiplication emits a light which is absorbed by adjacent photodetector channels, resulting in another problem of crosstalk.

The present invention was made to solve the above problems, and one object of the present invention is to provide a photodiode array having a high ratio of opening area to a light to be detected.

In order to achieve the above object, a photodiode array according to the present invention is the one in which a plurality of photodetector channels are formed on a substrate having a semiconductor layer of a first conductivity type, with a light to be detected being incident to the plurality of photodetector channels, characterized in that it comprises: the substrate; an epitaxial semiconductor layer of a second conductivity type which is formed on the semiconductor layer of the first conductivity type of the substrate and forms a pn junction at the interface with the semiconductor layer, and also has a plurality of multiplication regions for avalanche multiplication of carriers produced by the incidence of the light to be detected so that each of the multiplication regions corresponds to each of the photodetector channels; and a plurality of resistors each of which has two ends and is provided for each of the photodetector channels so as to be electrically connected to the epitaxial semiconductor layer via one end thereof and be connected to a signal conductor via the other end thereof.

In the above photodiode array, the pn junction is configured with the semiconductor layer of the first conductivity type of the substrate and the epitaxial semiconductor layer formed on the semiconductor layer. The multiplication regions are formed in the epitaxial semiconductor layer by which a pn junction is attained, and the multiplication regions corresponding to each of the photodetector channels are comprised in the epitaxial semiconductor layer. Therefore, the above photodiode array does not have any end (edge) of a pn junction where edge breakdown is caused when the photodiode array is caused to be operated in Geiger mode, and does not have to be provided with a guard ring. This allows the above photodiode array to have a higher ratio of opening area.

A photodiode array according to present invention is the one in which a plurality of photodetector channels are formed on a substrate having a semiconductor layer of a first conductivity type, with a light to be detected being incident to the plurality of photodetector channels, characterized in that it comprises: the substrate; an epitaxial semiconductor layer of the first conductivity type which is formed on the semiconductor layer of the first conductivity type of the substrate and has a plurality of multiplication regions for avalanche multiplication of carriers produced by the incidence of the light to be detected so that each of the multiplication regions corresponds to each of the photodetector channels; a diffusion region of a second conductivity type which is formed in the epitaxial semiconductor layer of the first conductivity type and forms a pn junction at the interface with the epitaxial semiconductor layer; and a plurality of resistors each of which has two ends and is provided for each of the photodetector channels so as to be electrically connected to the diffusion region of the second conductivity type in the epitaxial semiconductor layer via one end thereof and be connected to a signal conductor via the other end thereof.

In the above photodiode array, a pn junction is formed by the epitaxial semiconductor layer of the first conductivity type on the substrate and the epitaxial semiconductor layer of the second conductivity type formed in the former semiconductor layer. Also, the multiplication regions are formed in the epitaxial semiconductor layer by which the pn junction is attained, and the multiplication regions corresponding each of the photodetector channels are comprised in the epitaxial semiconductor layer. Therefore, the above photodiode array does not have any end (edge) of a pn junction where edge breakdown is caused when the photodiode array is caused to be operated in Geiger mode, and does not have to be provided with a guard ring. This allows the above photodiode array to have a higher ratio of opening area.

In order to arrange each multiplication region of the epitaxial semiconductor layer in correspondence to each photodetector channel, the photodiode array preferably further comprises a separating part of the first conductivity type which is formed between the plurality of photodetector channels. That is, a photodiode array according to present invention in which a plurality of photodetector channels are formed on a substrate having a semiconductor layer of a first conductivity type, with a light to be detected being incident to the plurality of photodetector channels, preferably comprises: the substrate; an epitaxial semiconductor layer of a second conductivity type which is formed on the semiconductor layer of the first conductivity type of the substrate and forms a pn junction at the interface with the substrate, and also has multiplication regions for avalanche multiplication of carriers produced by the incidence of the light to be detected; a plurality of resistors each of which has two ends and is provided for each of the photodetector channels so as to be electrically connected to the epitaxial semiconductor layer via one end thereof and be connected to a signal conductor via the other end thereof; and a separating part of the first conductivity type which is formed between the plurality of photodetector channels so that a plurality of multiplication regions of the epitaxial semiconductor layer are formed individually corresponding to each of the photodetector channels.

In the case, the separating part formed between the channels embodies the correspondence between each of the multiplication regions and each of the photodetector channels. As a result, the photodiode array does not have to be provided with a guard ring, which allows the photodiode array to have a higher ratio of opening area. In addition, the separating part between the photodetector channels enables to well restrain crosstalk.

The separating part preferably comprises a light shielding part formed of a material which absorbs or reflects a light of a wavelength band which is detected by the photodetector channels. Alternatively, the separating part preferably comprises a light shielding part formed of a material which has a lower refractive index than that of the epitaxial semiconductor layer. In these cases, the light is absorbed or reflected by the light shielding part, which enables to well restrain the generation of crosstalk. In addition, the light shielding part is preferably formed of a material which absorbs or reflects the light of a wavelength band which is detected by the photodetector channels, especially the light of an invisible to near infrared wavelength band which is generated by avalanche multiplication, in order to prevent the influence of the light emission due to avalanche multiplication onto the adjacent photodetector channels. This allows the generation of crosstalk to be well restrained.

The signal conductor is preferably formed above the separating part. In the case, this prevents the signal conductor from passing across a light detecting surface, which further improves the ratio of opening area.

Preferably the signal conductor is formed of aluminum, and is formed on a silicon nitride film. In the case, even when a high voltage is applied to the photodiode array, the penetration of aluminum into the underlying film can be restrained. The term "penetration" as used herein means diffusion and invasion, and will be used for the same meaning in the following description. Furthermore, in the case, preferably the resistors are formed of polysilicon for example and are formed on a silicon dioxide film, and also have a silicon nitride film and a signal conductor formed thereon.

According to the present invention, a photodiode array having a high ratio of opening area to a light to be detected can be provided.

Figure 1:
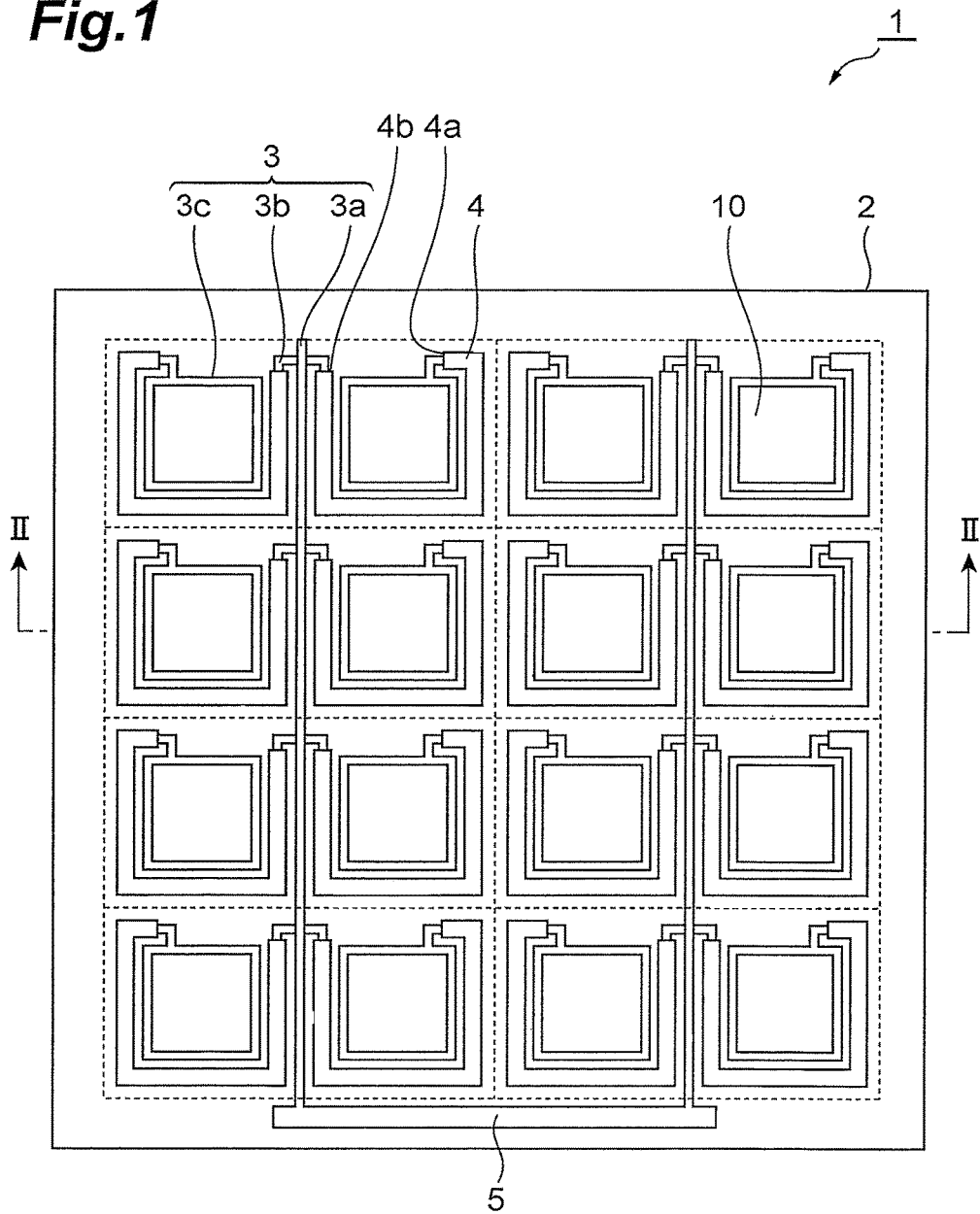
FIG. 1 is a view schematically showing an upper surface of a photodiode array according to a first embodiment.

DESCRIPTION OF SYMBOLS 1, 30, 40, 50 photodiode array
2 substrate 3 signal conductor
4 resistor
5 electrode pad
10 photodetector channel
11 insulator
12 n$^+$-type semiconductor layer
13 p$^-$-type semiconductor layer
14 p$^+$-type semiconductor layer
15 p-type semiconductor layer
16 protective film
20 separating part
22 light shielding part
S substrate member
AM multiplication region
R13 n-type semiconductor layer
R15 n-type semiconductor layer

BEST MODES FOR CARRYING OUT THE INVENTION

Now, with reference to the accompanying drawings, preferred embodiments will be explained below in detail. In the following explanation, the same elements or the elements having the same function are denoted by the same reference numeral, and the duplicated explanation of the elements will be avoided.

First Embodiment

Figure 2:
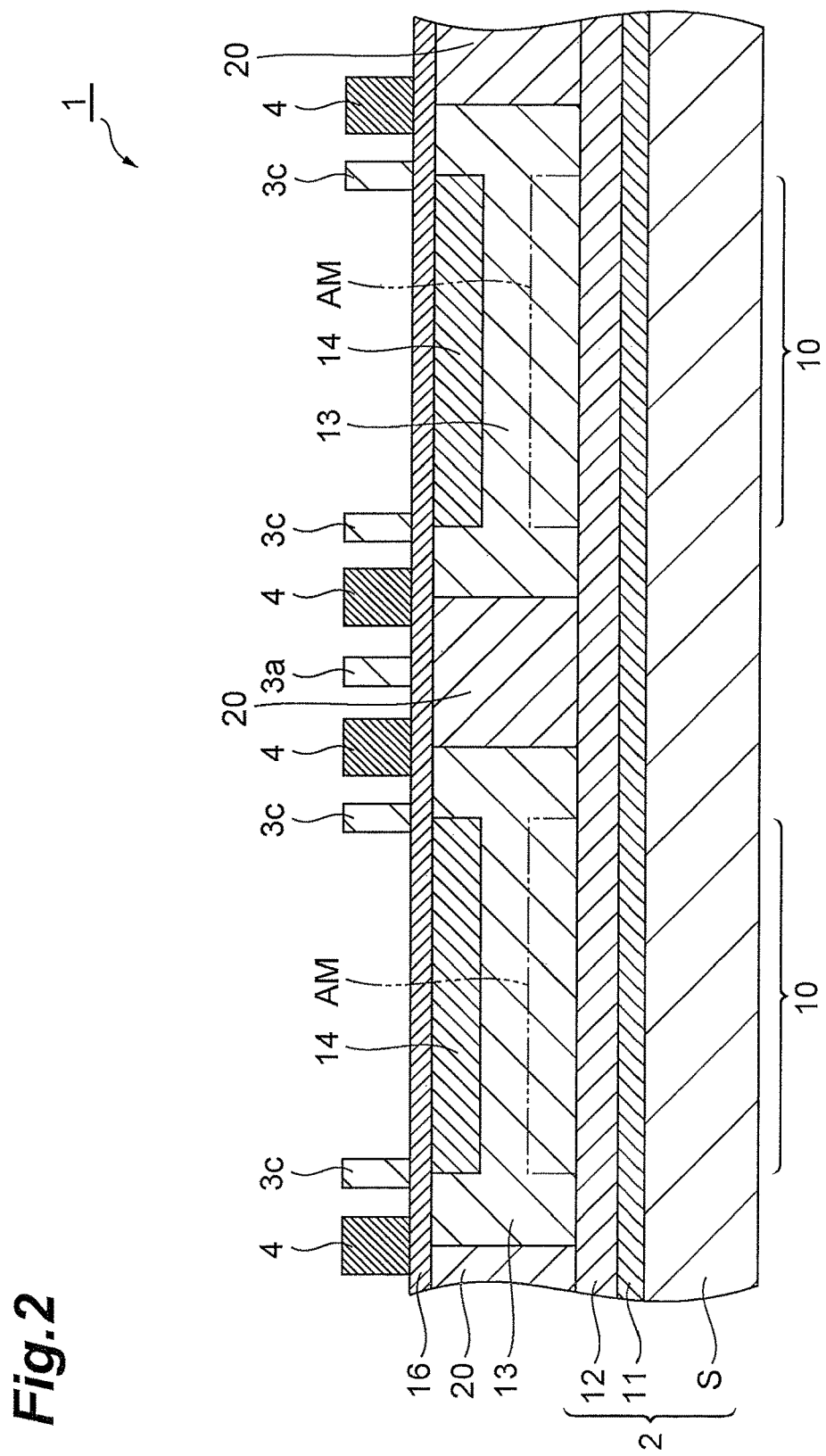
FIG. 2 is a view showing a part of the cross section taken along the line II-II of the photodiode array according to the first embodiment.

With reference to FIG. 1 and FIG. 2, the configuration of a photodiode array 1 according to a first embodiment will be explained below. FIG. 1 is a view schematically showing an upper surface of the photodiode array 1 according to a first embodiment. FIG. 2 is a view showing a part of the cross section taken along the line II-II of the photodiode array 1 according to the first embodiment.

The photodiode array 1 is formed with a plurality of semiconductor layers and an insulating layer laminated to a substrate 2. As shown in FIG. 1, the photodiode array 1 is a multichannel avalanche photodiode for photon counting having a plurality of photodetector channels 10 formed in a matrix (4×4 in the present embodiment) to which a light to be detected is incident. The photodiode array 1 has a signal conductor 3, resistors 4, and an electrode pad 5 on the upper surface thereof. The substrate 2 is a square with a side of about 1 mm, for example. Each of the photodetector channels 10 is a square, for example.

The signal conductor 3 comprises a reading part 3a for transmitting signals outputted from each photodetector channel 10, a connecting part 3b for connecting between each of the resistors 4 and the reading part 3a, and a channel surrounding part 3c which is arranged to surround the outer periphery of each photodetector channel 10. The reading part 3a is connected to each of the photodetector channels 10 which are disposed in the two columns adjacent to the reading part 3a, and is connected to the electrode pad 5 at one end thereof. In the present embodiment, because the photodiodes are arranged in a matrix of 4×4, there are two reading parts 3a arranged on the photodiode array 1, and both of the reading parts 3a are connected to the electrode pad 5. The signal conductor 3 is formed of aluminum (Al), for example.

The resistor 4 is provided to each of the photodetector channels 10 via one end 4a of the resistor 4 and the channel surrounding part 3c, and is connected to the reading part 3a via the other end 4b of the resistor 4 and the connecting part 3b. The plurality of resistors 4 (eight in the present embodiment) connected to a common reading part 3a are connected to the reading part 3a. The resistor 4 is formed of polysilicon (Poly-Si), for example.

Next, with reference to FIG. 2, the cross sectional configuration of the photodiode array 1 will be explained below. As shown in FIG. 2, the photodiode array 1 comprises the substrate 2 having a semiconductor layer of n-type (a first conductivity type), a p$^-$-type semiconductor layer 13 of p-type (a second conductivity type) which is formed on the substrate 2, a p$^+$-type semiconductor layer 14 of p-type which is formed on the p$^-$-type semiconductor layer 13, a protective film 16, a separating part 20 of n-type (the first conductivity type) which is formed on the p$^-$-type semiconductor layer 13, and the above signal conductor 3 and the resistors 4 formed on the protective film 16. The light to be detected is incident from the upper surface side shown in FIG. 2.

The substrate 2 comprises a substrate member S, an insulator 11 formed on the substrate member S, and an n$^+$-type semiconductor layer 12 formed on the insulator 11. The substrate member S is formed of Si (silicon), for example. The insulator 11 is formed of SiO$_2$ (silicon dioxide), for example. The n$^+$-type semiconductor layer 12 is formed of Si for example, and is a semiconductor layer of n-type having a high impurity concentration.

The p$^-$-type semiconductor layer 13 is an epitaxial semiconductor layer of p-type having a low impurity concentration. The p$^-$-type semiconductor layer 13 forms a pn junction at the interface between the substrate 2. The p$^-$-type semiconductor layer 13 has a plurality of multiplication regions AM for avalanche multiplication of carriers that are produced by the incidence of the light to be detected, corresponding to each of the photodetector channels 10. The p$^-$-type semiconductor layer 13 has a thickness of 3 μm to 5 μm, for example. The p$^-$-type semiconductor layer 13 is formed of Si, for example.

The p$^+$-type semiconductor layer 14 is formed on the p$^-$-type semiconductor layer 13 in correspondence to the multiplication region AM of each photodetector channel 10. That is, the area near the interface between the substrate 2 and the p$^-$-type semiconductor layer 13 which is positioned below the p$^+$-type semiconductor layer 14 in the direction of the lamination of semiconductor layer (hereinafter, simply referred to as lamination direction) is the multiplication region AM. The p$^+$-type semiconductor layer 14 is formed of Si, for example.

The separating part 20 is formed between the plurality of photodetector channels 10 for separating the photodetector channels 10 from each other. That is, the separating part 20 is formed so that one multiplication region AM can be formed in the p$^-$-type semiconductor layer 13 corresponding to each of the photodetector channels 10. The separating part 20 is formed in a two-dimensional lattice structure on the substrate 2 to completely surround each of the multiplication regions AM. The separating part 20 is formed from the upper surface through to the lower surface of the p$^-$-type semiconductor layer 13. The separating part 20 is a semiconductor layer of n-type having a high impurity concentration, with the impurity being composed of P for example. When the separating parts 20 is formed by diffusion, the process takes a long time of period, which may cause the impurity in the n$^+$-type semiconductor layer 12 to be diffused into the epitaxial semiconductor layer to build a ridge at the interface of a pn junction. In order to prevent the ridge, a trench etch process may be performed on the central part of the area for the separating parts 20 before the impurity is caused to be diffused and the separating part 20 is formed. The details will be explained later in other embodiments, but the trench groove may be filled with a material which absorbs or reflects the light of a wavelength band which the photodetector channel absorbs so as to form a light shielding part, so that crosstalk which is produced by the influence of the light emission due to avalanche multiplication onto the adjacent photodetector channels can be prevented.

The p⁻-type semiconductor layer 13, the p⁺-type semiconductor layer 14, and the separating part 20 form a flat plane on the upper surface side of the photodiode array 1, and the protective film 16 is formed on these elements. The protective film 16 is formed with an insulating layer which is formed of SiO₂, for example.

The protective film 16 has the signal conductor 3 and the resistor 4 formed thereon. The reading part 3a of the signal conductor 3 and the resistor 4 are formed above the separating parts 20.

The signal conductor 3 functions as an anode, and as a cathode, not shown, but a transparent electrode layer (for example, a layer formed of ITO (Indium Tin Oxide)) may be provided all over the lower surface side (the side without the insulating layer 11) of the substrate 2. Alternatively, as a cathode, the electrode part may be formed to be exposed to the surface side.

Figure 3:
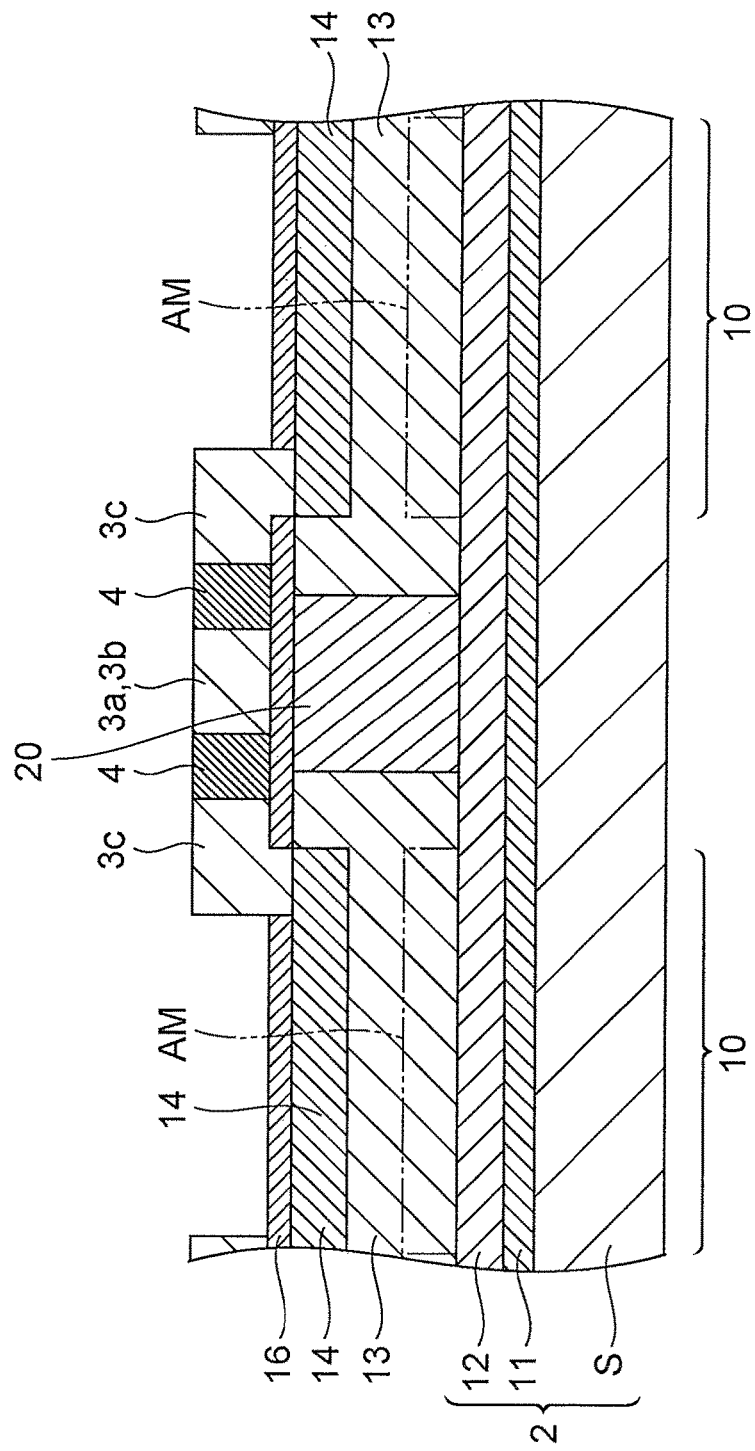
FIG. 3 is a view schematically illustrating the connection between each photodetector channel and signal conductor and resistors.

Now, with reference to FIG. 3, the connection between each photodetector channel 10 and the signal conductor 3 and resistor 4. FIG. 3 is a view schematically illustrating the connection between each photodetector channel 10 and the signal conductor 3 and resistor 4. As shown in FIG. 3, the p⁺-type semiconductor layer 14 of each photodetector channel 10 and the signal conductor 3 (the channel surrounding part 3c) are directly connected to each other. This makes the signal conductor 3 (the channel surrounding part 3c) and the p⁻-type semiconductor layer 13 be electrically connected to each other. Also, the p⁻-type semiconductor layer 13 and one end 4a of the resistor 4 are connected via the signal conductor 3 (the channel surrounding part 3c), while the resistors 4 are individually connected to the reading part 3a via the connecting part 3b at the other ends 4b thereof.

When used for photon counting, the photodiode array 1 as configured above is caused to be operated under an operating condition, called Geiger mode. In Geiger mode operation, each photodetector channel 10 is applied with a reverse voltage (for example, 50 V or more) that exceeds a breakdown voltage. In the state, when a light to be detected is incident to each photodetector channel 10 from the upper surface side thereof, the light to be detected is absorbed in the photodetector channel 10 to generate carriers. The generated carriers are accelerated and moved according to the electric field in the photodetector channel 10 for multiplication at each multiplication region AM. The multiplied carriers are drawn outside through the resistor 4 by the signal conductor 3, which are detected based on the peak value of the outputted signal. The channels that detected photons individually provide an equal amount of output, thereby the detection of the total output of the entire channels enables the counting of the photodetector channels 10 out of the photodiode array 1 which provided the outputs. Therefore, in the photodiode array 1, one light emission of the light to be detected enables the photon counting.

In the photodiode array 1, a pn junction is configured with the n⁺-type semiconductor layer 12 of the substrate 2 and the p⁻-type semiconductor layer 13 which is an epitaxial semiconductor layer formed on the n⁺-type semiconductor layer 12 of the substrate 2. Also, the multiplication regions AM are formed in the p⁻-type semiconductor layer 13 by which the pn junction is attained, and the correspondence of each multiplication region AM to each photodetector channel 10 is realized by the separating parts 20 which are formed between the photodetector channels 10. The pn junction has surfaces which are configured with the interface between the n⁺-type semiconductor layer 12 and the p⁻-type semiconductor layer 13 and the interface between the separating parts 20 and the p⁻-type semiconductor layer 13, so that the region having a high impurity concentration becomes convex and the region having a high electric field is eliminated. As a result, the photodiode array 1 does not have any end (edge) of a pn junction where edge breakdown is caused when the photodiode array is caused to be operated in Geiger mode. Therefore, the photodiode array 1 does not have to be provided with a guard ring for the pn junction of each photodetector channel 10. This allows the photodiode array 1 to have an extremely high ratio of opening area.

In addition, the high ratio of opening area allows the photodiode array 1 to have a high detection efficiency.

Moreover, the photodetector channels 10 separated from each other by the separating part 20 well restrain crosstalk.

In the operation in Geiger mode, even when the voltage difference between the photodetector channel with incident photons and that without photons is large, the separating layer 20 formed between the photodetector channels 10 sufficiently separate the channels.

In the photodiode array 1, the reading part 3a of the signal conductor 3 is formed above the separating parts 20. This prevents the signal conductor 3 from passing across above the multiplication region AM, that is, on the light detecting surface, which further improves the ratio of opening area. This is also considered to be effective in restraining dark current. In the photodiode array 1, the resistors 4 are also formed above the separating parts 20, which further improves the ratio of opening area.

The applicant of the present invention has found, based on the wavelength dependency of afterpulse, that a problem arises that a part of holes generated at the n-type semiconductor substrate enter the multiplication region later and cause afterpulse when an n-type semiconductor substrate is used and a p-type epitaxial semiconductor layer is formed on the n-type semiconductor substrate. With respect to the problem, in the photodiode array 1, for example, an insulator 11 formed of SiO₂ is interposed between the substrate member S and the n⁺-type semiconductor layer 12, so that the substrate member S and the n⁺-type semiconductor layer 12 can be completely separated from each other, which prevents afterpulse.

Figure 4:
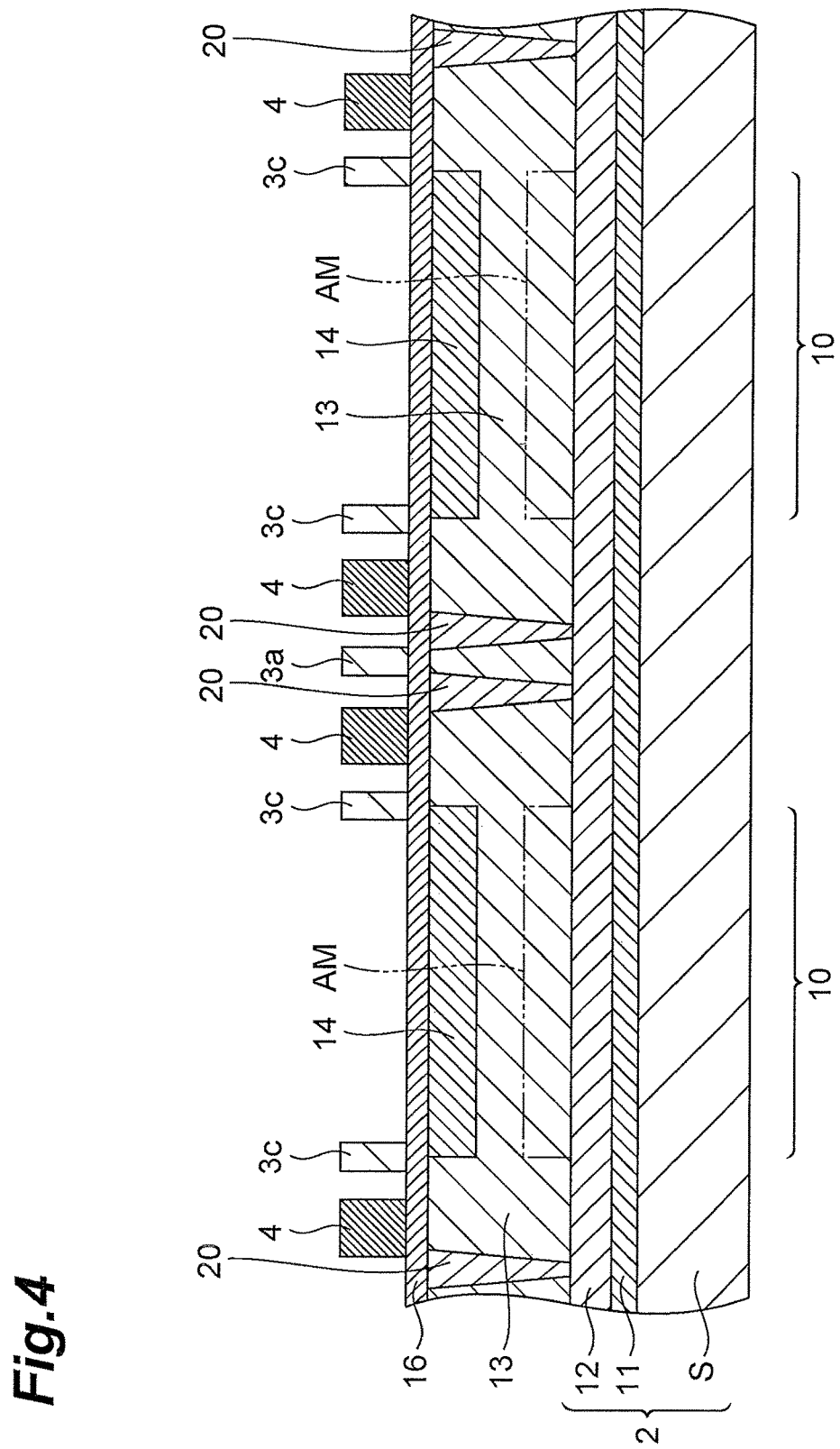
FIG. 4 is a cross sectional view showing a first modification of the photodiode array according to the first embodiment.

Various modifications can be applied to the separating parts 20 of the present embodiment. FIG. 4 is a cross sectional view showing a first modification of the photodiode array 1 according to the present embodiment. In a photodiode array according to a first modification, a plurality of (two in the present modification) separating parts 20 are formed between the photodetector channels 10.

Figure 5:
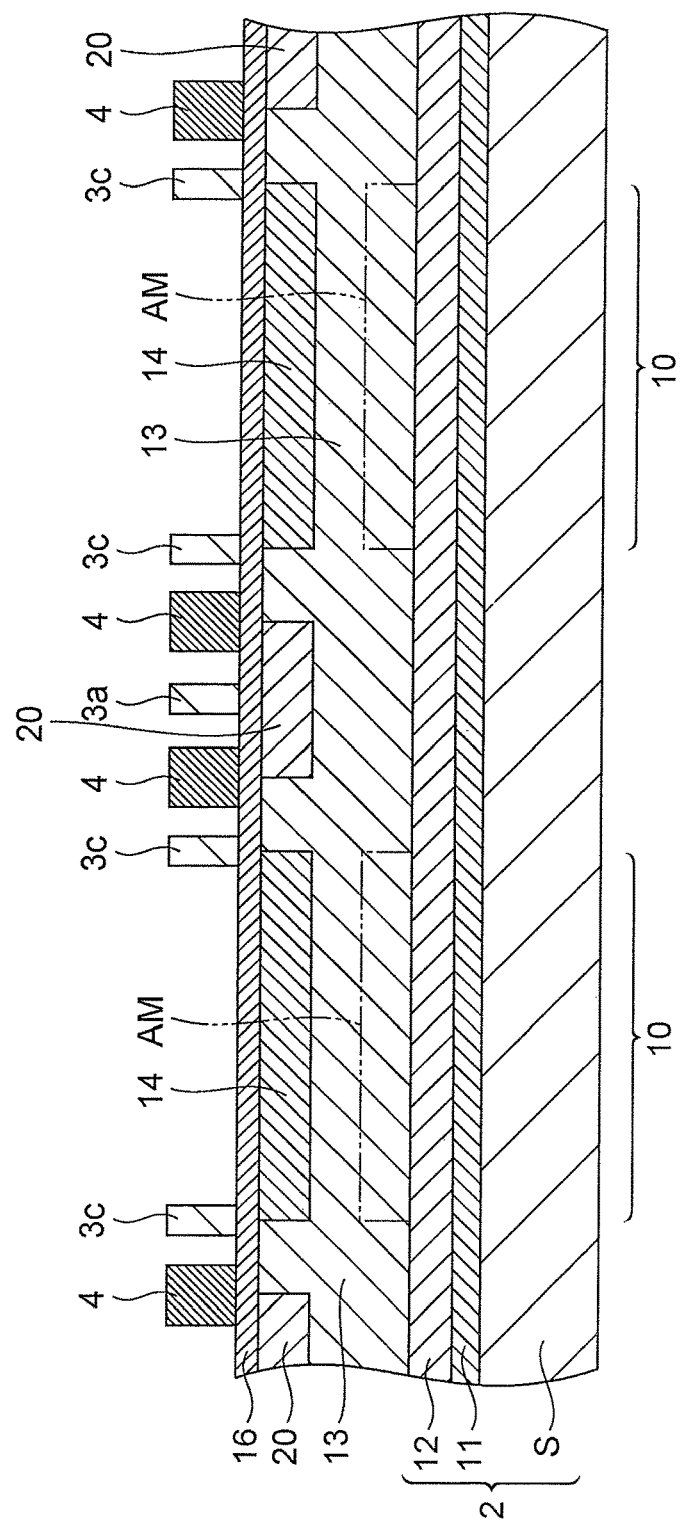
FIG. 5 is a cross sectional view showing a second modification of the photodiode array according to the first embodiment.

FIG. 5 is a cross sectional view showing a second modification of the photodiode array 1 according to the present embodiment. In a photodiode array according to a second modification, the separating parts 20 are formed only near the upper surface (the surface to which a light to be detected is incident), and do not pass from the upper surface side through to the lower surface side of the p⁻-type semiconductor layer 13 in the lamination direction.

Also in the above embodiment, the epitaxial semiconductor layer is the one of a second conductivity type, but the epitaxial semiconductor layer may be the one of the first conductivity type that has a diffusion region of the second conductivity type formed therein, so that a pn junction is configured with the epitaxial semiconductor layer of the first conductivity type and the diffusion region of the second conductivity type.

Second Embodiment

Figure 6:
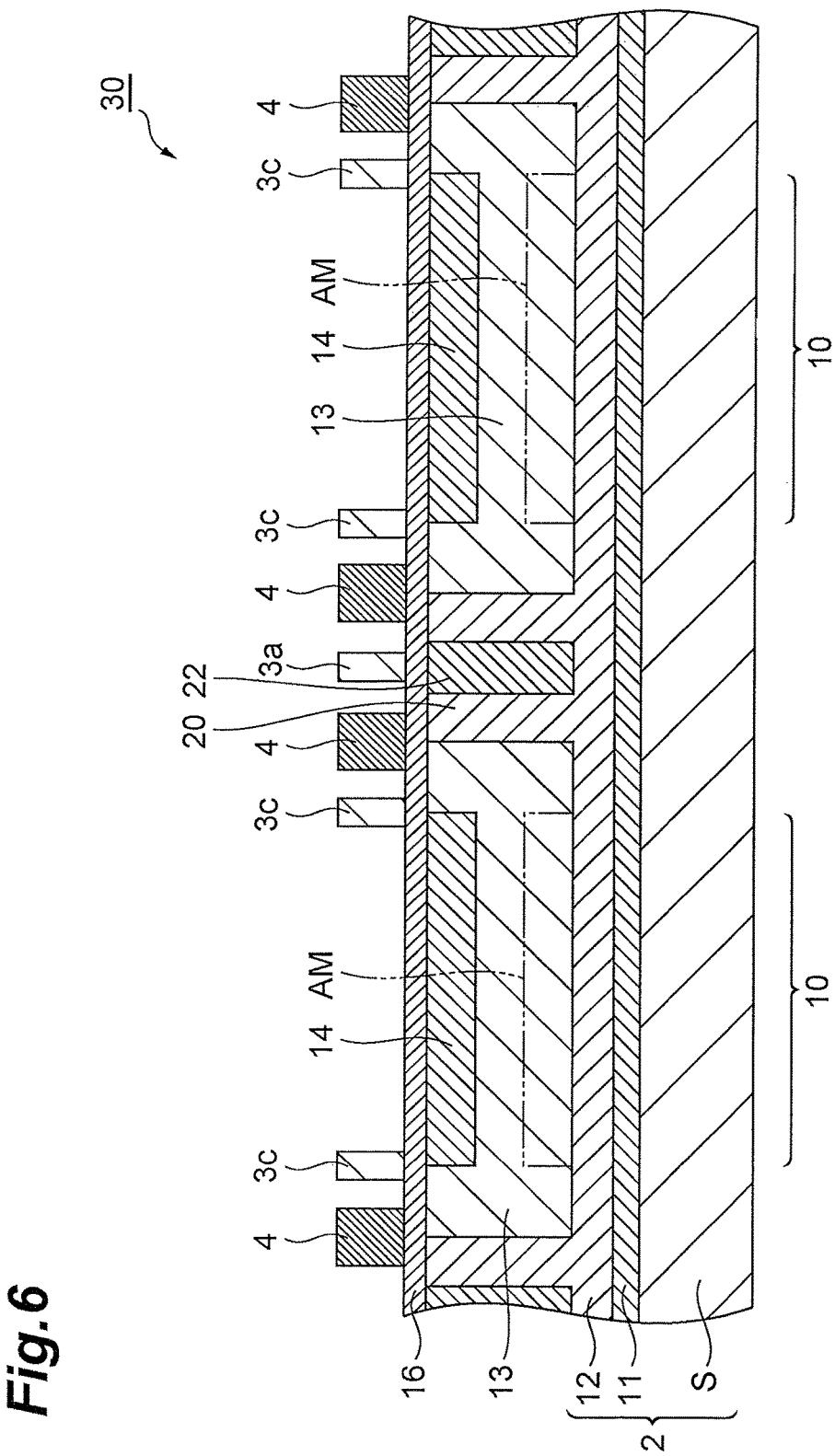
FIG. 6 is a cross sectional view showing a photodiode array according to a second embodiment.

With reference to FIG. 6, the configuration of a photodiode array 30 according to a second embodiment will be explained below. FIG. 6 is a view schematically illustrating the cross sectional structure of the photodiode array 30 according to the second embodiment. The photodiode array 30 according to the third embodiment is similar to the photodiode array 1 according to the first embodiment except that the separating part 20 has a light shielding part.

As shown in FIG. 6, the separating parts 20 comprises a light shielding part 22 formed of a material which absorbs a light of a wavelength band (from invisible to near infrared) which is to be detected by the photodetector channel 10. The light shielding part 22 is formed to be embedded in the separating part 20 like a core extending from the upper surface side to the lower surface side of the p⁻-type semiconductor layer 13. The light shielding part 22 is formed of a metal such as black photo-resist which is obtained by mixing a black dye or a pigment such as insulation-processed carbon black into photoresist, and tungsten. However, when the light shielding part 22 is formed of a non-insulative material (for example, a metal such as tungsten), the light shielding part 22 has to be coated with an insulator such as $SiO_2$. As described in the above first embodiment, when the separating part 20 is formed by diffusion, the process takes a long time of period, which may cause the impurity in the n⁺-type semiconductor layer 12 to be diffused to the epitaxial semiconductor layer and to build a ridge at the interface of a pn junction. In order to prevent the ridge, a trench etch process may be performed on the central part of the area for the separating parts 20 before the impurity is caused to be diffused and the separating part 20 is formed. As shown in FIG. 6, after the diffusion of impurity, the n⁺-type semiconductor layer 12 and the separating part 20 are connected to each other. The remaining trench groove may be filled with a material which absorbs the light having a wavelength band the photodetector channels absorb as described above (as will be explained later, the groove may be filled with a material which reflects the light of a wavelength band which the photodetector channels absorb) so as to form a light shielding part, so that crosstalk which is produced by the influence of the light emission due to avalanche multiplication onto the adjacent photodetector channels can be prevented.

As in the case with the photodiode 1, the photodiode array 30 does not have any end (edge) of a pn junction where edge breakdown is caused when the photodiode array is caused to be operated in Geiger mode. Therefore, the photodiode array 30 also does not have to be provided with a guard ring for the pn junction of each photodetector channel 10. This allows the photodiode array 30 to have a high ratio of opening area.

In addition, the high ratio of opening area allows the photodiode array 30 to have a high detection efficiency.

Moreover, the photodetector channels 10 which are separated from each other by the separating parts 20 well restrain crosstalk.

In the photodiode array 30 also, the reading part 3a of the signal conductor 3 is formed above the separating parts 20, which further improves the ratio of opening area. This is also considered to be effective in restraining dark current.

Furthermore, in the photodiode array 30 also, the insulator 11 is interposed between the substrate member S and the n⁺-type semiconductor layer 12, which enables to restrain afterpulse.

Also, each separating parts 20 comprises the light shielding part 22 formed of a material which absorbs light of a wavelength band which is to be detected by the photodetector channel 10. As a result, the light to be detected is absorbed at the light shielding part, which well restrains the generation of crosstalk. Moreover, the light shielding part 22 is formed of a material which absorbs the light of a wavelength band which is detected by the photodetector channel 10, especially the light of an invisible to near infrared wavelength band which is generated by avalanche multiplication, in order to prevent the influence of the light emission due to avalanche multiplication onto the adjacent photodetector channels 10, which well restrains the generation of crosstalk.

In addition to the material which absorbs an invisible to near infrared light, the light shielding part 22 may be formed of a material which reflects an invisible to near infrared light. Even in the case, because the light to be detected is reflected by the light shielding part, the generation of crosstalk can be well restrained. Moreover, the light shielding part 22 is formed of a material which reflects the light having a wavelength band of light detected by the photodetector channel 10, especially the light having an invisible to near infrared wavelength band which is generated by avalanche multiplication, in order to prevent the influence of the light emission due to avalanche multiplication onto the adjacent photodetector channels 10, which well restrains the generation of crosstalk.

In addition to the material which absorbs or reflects an invisible to near infrared light, the light shielding part 22 may be formed of a material which absorbs or reflects the light of a wavelength band which is to be detected by the photodetector channel 10. However, the light shielding part 22 is preferably formed of a material which absorbs or reflects the light of a wavelength band of light which is detected by the photodetector channel 10, especially the light of an invisible to near infrared wavelength band which is generated by avalanche multiplication, in order to prevent the influence of the light emission due to avalanche multiplication onto the adjacent photodetector channels 10.

The light shielding part 22 may be formed of a material having a lower refractive index than that of the separating parts 20. Even in these cases, because a light is reflected by the light shielding part, the generation of crosstalk can be well restrained.

Third Embodiment

Figure 7:
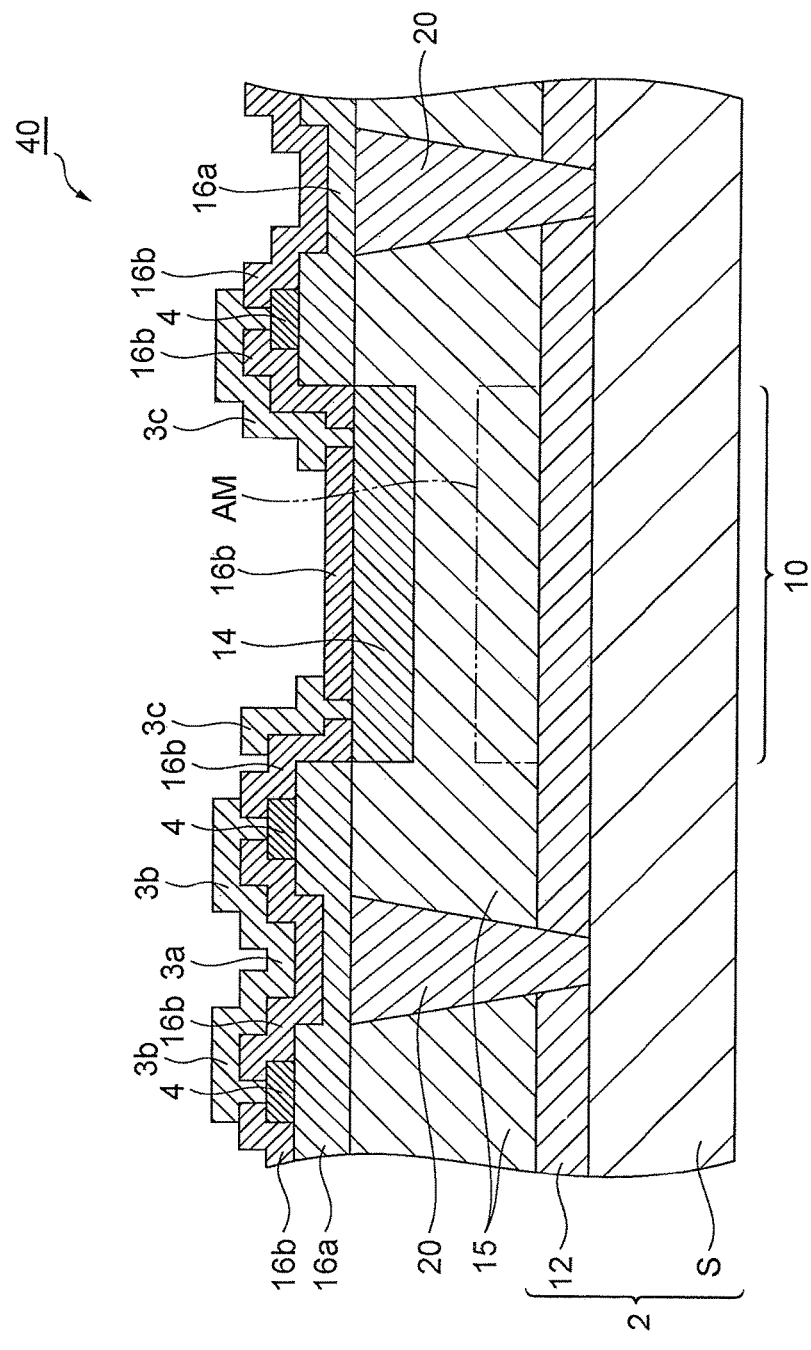
FIG. 7 is a view schematically illustrating a cross sectional structure of a photodiode array according to a third embodiment.

With reference to FIG. 7, the configuration of a photodiode array 40 according to a third embodiment will be explained below. FIG. 7 is a view schematically illustrating the cross sectional structure of the photodiode array 40 according to a third embodiment. The photodiode array 40 according to the third embodiment is similar to the photodiode array 1 according to the first embodiment except that the signal conductor 3 is formed on a silicon nitride film.

As shown in FIG. 7, the photodiode array 40 comprises the substrate 2 having a semiconductor layer of n-type (a first conductivity type), the p-type semiconductor layer 15 of p-type (a second conductivity type) which is formed on the substrate 2, the p⁺-type semiconductor layer 14 of p-type which is formed on the p-type semiconductor layer 15, protective films 16a and 16b, the separating part 20 of n-type (the first conductivity type) formed on the p-type semiconductor layer 15, the signal conductor 3 formed of aluminum, and resistors 4 formed of Poly-Si for example. A light to be detected is incident from the upper side of FIG. 7.

The substrate 2 comprises an $n^+$-type substrate member S, and an n-type semiconductor layer 12 formed on the substrate member S.

The p-type semiconductor layer 15 is an epitaxial semiconductor layer of p-type having a lower impurity concentration than that of the $p^+$-type semiconductor layer 14. The p-type semiconductor layer 15 forms a pn junction at the interface between the n-type semiconductor layer 12 of the substrate 2. The p-type semiconductor layer 15 has a plurality of multiplication regions AM for avalanche multiplication of carriers produced by the incidence of the light to be detected, corresponding to each of the photodetector channels 10. The p-type semiconductor layer 15 is formed of Si, for example.

The p-type semiconductor layer 15, the $p^+$-type semiconductor layer 14, and the separating part 20 form a flat surface on the upper surface side of the photodiode array 40, and have the protective films 16a and 16b formed thereon. The protective film 16a is formed of an insulator which is composed of a silicon dioxide film ($SiO_2$ film), while protective film 16b is formed of an insulator which is composed of silicon nitride (SiN film or $Si_3N_4$ film).

As shown in FIG. 7, the separating parts 20 have the protective film 16a, the resistor 4, the protective film 16b, and the signal conductor 3 laminated thereon in the order. Specifically, the protective film 16a is laminated to the separating parts 20. The resistor 4 is laminated to the protective film 16a. The protective film 16b is laminated to the protective film 16a and the resistors 4, except a part of the resistors 4. The signal conductor 3 is laminated for electrical connection on the protective film 16b and the resistor 4 having no laminated protective film 16b thereon. Specifically, the reading part 3a of the signal conductor 3 is laminated between the resistors 4, and the signal conductor 3 is laminated for electrical connection to the resistors 4 as the electrical connection to the connecting part 3b or channel surrounding part 3c.

Moreover, as shown in FIG. 7, the $p^+$-type semiconductor layer 14 has the protective film 16b laminated thereon except a part of the $p^+$-type semiconductor layer 14. On the part of the $p^+$-type semiconductor layer 14 having no laminated protective film 16b thereon and a part of the protective film 16b laminated to the pt-type semiconductor layer 14, the channel surrounding part 3c of the signal conductor 3 is laminated for electrical connection.

As in the case with the photodiode 1, the photodiode array 40 does not have any end (edge) of a pn junction where edge breakdown is caused when the photodiode array is caused to be operated in Geiger mode. Therefore, the photodiode array 40 also does not have to be provided with a guard ring for the pn junction of each photodetector channel 10. This allows the photodiode array 40 to have a high ratio of opening area.

In addition, the high ratio of opening area allows the photodiode array 40 to have a high detection efficiency.

Moreover, the photodetector channels 10 which are separated from each other by the separating parts 20 well restrain crosstalk.

In the photodiode array 40 also, the reading part 3a of the signal conductor 3 is formed above the separating parts 20, which further improves the ratio of opening area. This is also considered to be effective in restraining dark current.

When the signal conductor 3 composed of aluminum is formed on an oxide film for example, there arises a problem that the aluminum is caused to penetrate the underlying film upon an application of a high voltage. With respect to the problem, in the photodiode array 40, the signal conductor 3 is formed on the protective film 16b which is composed of a silicon nitride film. As a result, even when a high voltage is applied to the photodiode array 40, the penetration of aluminum into the underlying film (protective film 16b) can be restrained.

In addition, under the reading part 3a of the signal conductor 3, the protective film 16b and the protective film 16a or the resistors 4 are laminated. This well restrains the penetration of the aluminum into the separating parts 20 and the p-type semiconductor layer 15 upon an application of a high voltage.

In this way, in the photodiode array 40, even when a high voltage is applied, the penetration of the aluminum into photodetector channel 10 and the separating parts 20 is preferably restrained.

The resistors 4 formed of polysilicon (Poly-Si) for example are formed on the protective film 16a, and also have the protective film 16b and the signal conductor 3 formed thereon.

Instead of the n-type semiconductor layer 12, a p-type semiconductor layer may be used. In the case, a pn junction is configured between the p-type semiconductor layer and the $n^+$-type substrate member S (substrate 2), and the multiplication regions AM are formed in the p-type semiconductor layer.

Fourth Embodiment

Figure 8:
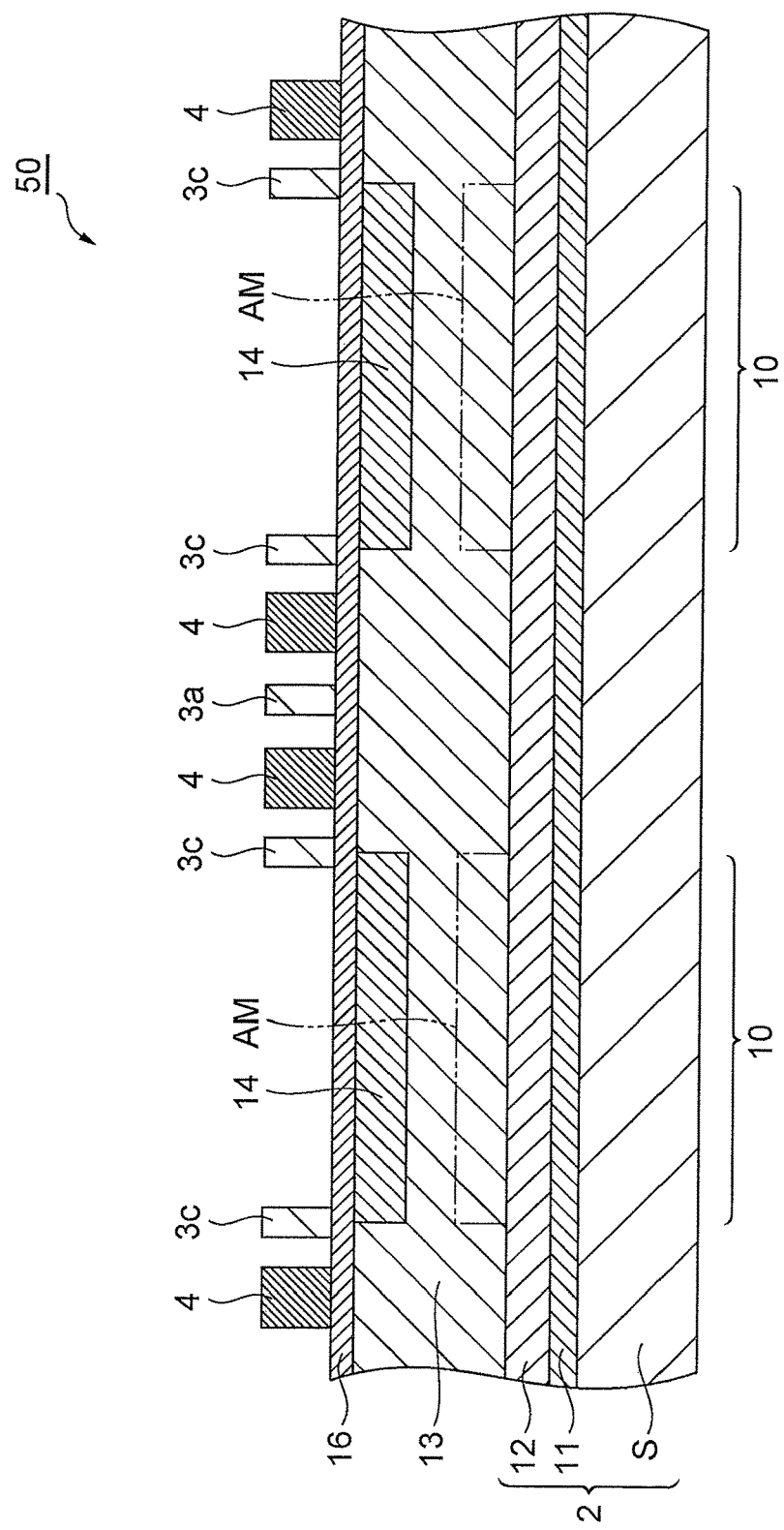
FIG. 8 is a cross sectional view showing a photodiode array according to a fourth embodiment.

With reference to FIG. 8, the configuration of a photodiode array 50 according to a fourth embodiment will be explained below. FIG. 8 is a cross sectional view showing the photodiode array 50 according to the fourth embodiment. The photodiode array 50 according to the fourth embodiment is similar to the photodiode array 1 according to the first embodiment except that the photodiode array 50 does not comprise the separating part 20.

As shown in FIG. 8, the $p^-$-type semiconductor layer 13 has a plurality of multiplication regions AM so that each of the multiplication regions AM correspond to each of the photodetector channel 10. Between the photodetector channels 10, the signal conductor 3 and the resistors 4 are formed.

As in the case with the photodiode 1, the photodiode array 50 does not have any end (edge) of a pn junction where edge breakdown is caused when the photodiode array is caused to be operated in Geiger mode. Therefore, the photodiode array 50 also does not have to be provided with a guard ring for the pn junction of each photodetector channel 10. This allows the photodiode array 50 to have a high ratio of opening area. Moreover, the photodiode array 50 having no separating part is able to exhibit a further higher ratio of opening area.

In addition, the high ratio of opening area allows the photodiode array 50 to have a high detection efficiency.

In the photodiode array 50, the reading part 3a of the signal conductor 3 is formed between the photodetector channel 10, which further improves the ratio of opening area. This is also considered to be effective in restraining dark current.

Moreover, in the photodiode array 50 also, the insulator 12 is provided between the substrate member S and the n+-type semiconductor layer 12, which enables to restrain afterpulse.

While, although the preferred embodiments and modifications of the present invention have been explained, the present invention is not limited to the above embodiments and modifications, and various changes can be added thereto. For example, the number of the photodetector channels formed in the photodiode array is not limited to the one (4×4) in the above embodiment. Also, the number of the separating parts 20 formed between the photodetector channel 10 is not limited to the one shown in the above embodiments and modifications, and may be three or more for example. The signal conductor 3 may not formed above the separating parts 20. Also, the resistors 4 may not formed above the separating parts 20. The layers and the like are not limited to those illustrated in the above embodiments and modifications.

Under the n-type semiconductor layer 12, a buffer layer formed of an n-type semiconductor may be used. Instead of the n-type semiconductor layer 12, a p-type semiconductor layer may be used, under which the buffer layer formed of an n-type semiconductor may be used. In the case, a pn junction is formed between the p-type semiconductor layer and the n-type buffer layer, and a multiplication region AM is formed in the p-type semiconductor layer. Moreover, in the case without the insulator 11 of the third embodiment, a p-type semiconductor layer may be used instead of the n-type semiconductor layer 12, under which a buffer layer formed of a p-type semiconductor may be used. In the case, a pn junction is formed between the p-type buffer layer and the n+-type substrate member S (substrate 2), and a multiplication region AM is formed in the p-type buffer layer.

In the above described photodiode arrays, a plurality of avalanche photodiodes (which are composed of pn junctions of the detector channels 10) that operate in Geiger mode are two-dimensionally arranged, and the avalanche photodiodes comprise the highly crystalline epitaxial semiconductor layer 13. The above described photodiode arrays comprise the resistor 4 which is electrically connected to the avalanche photodiode at one end (anode) thereof and is arranged on the light incident surface of the avalanche photodiode; and the signal conductor 3 which is connected to the other end of the resistor 4, and no guard ring is interposed between the adjacent avalanche photodiodes. In the structure, there in no guard ring, which allows the opening areas of detector channels to be increased.

Figure 9:
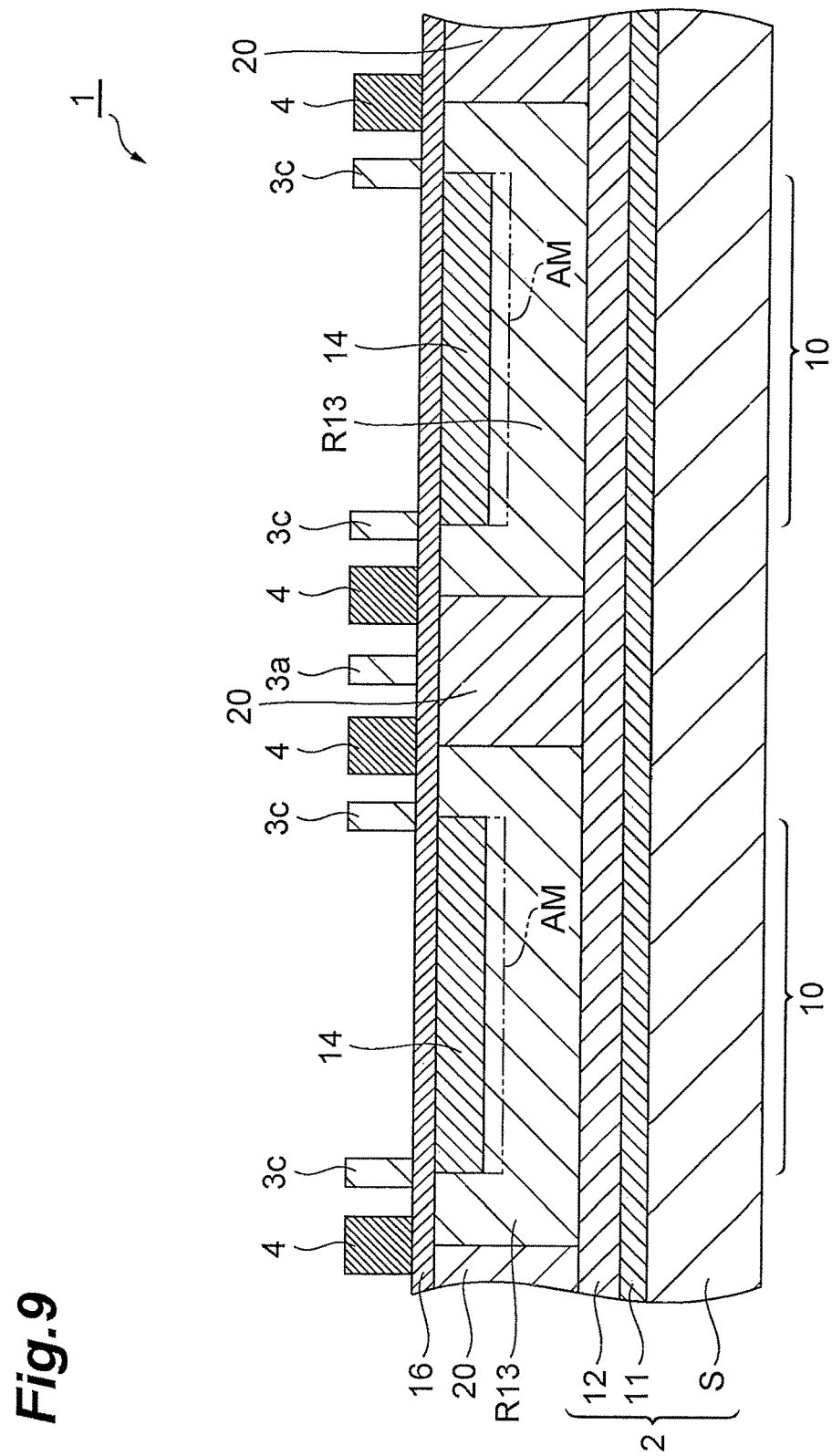
FIG. 9 is a cross sectional view showing a photodiode array according to a modification of the layer structure of the embodiment shown in FIG. 2.
Figure 10:
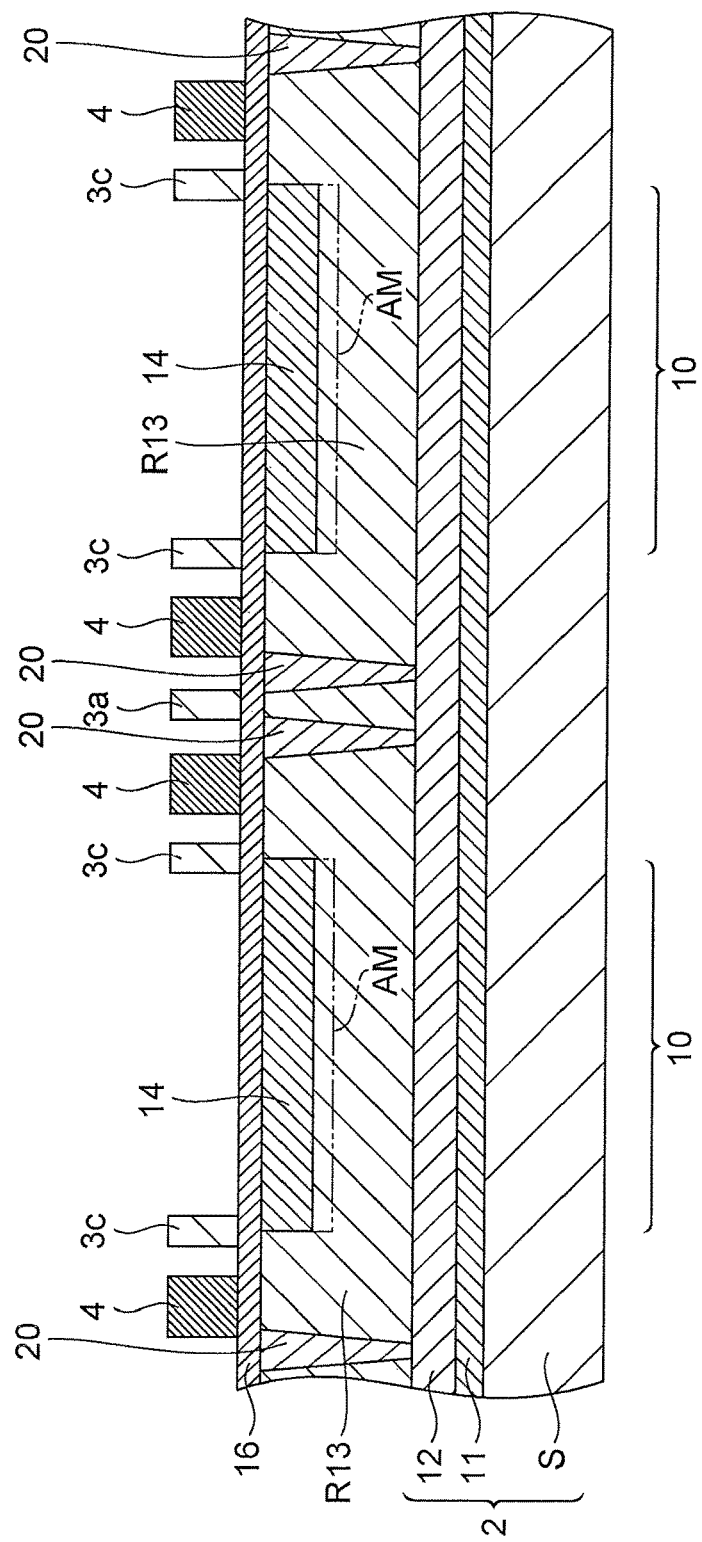
FIG. 10 is a cross sectional view showing a photodiode array according to a modification of the layer structure of the embodiment shown in FIG. 4.
Figure 11:
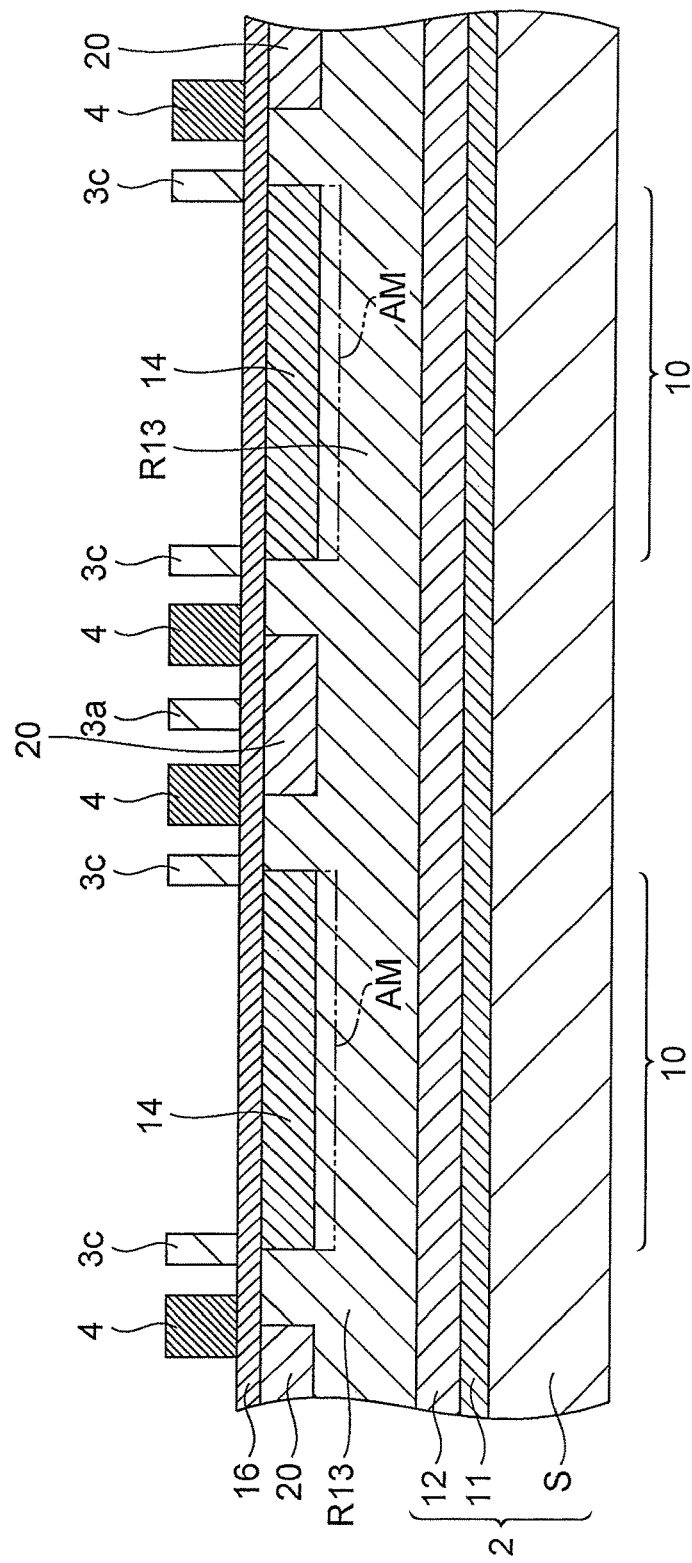
FIG. 11 is a cross sectional view showing a photodiode array according to a modification of the layer structure of the embodiment shown in FIG. 5.
Figure 12:
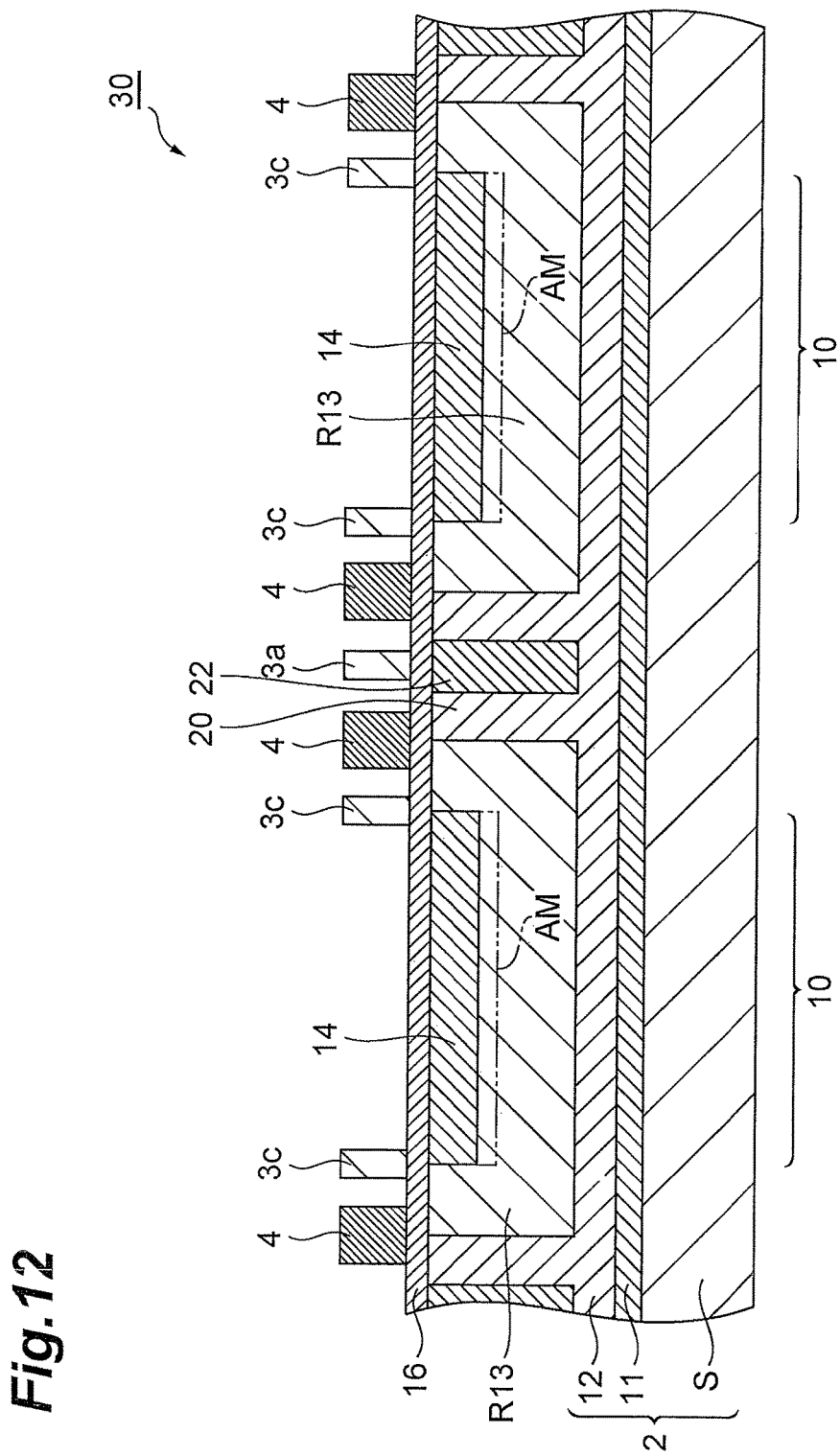
FIG. 12 is a cross sectional view showing a photodiode array according to a modification of the layer structure of the embodiment shown in FIG. 6.
Figure 13:
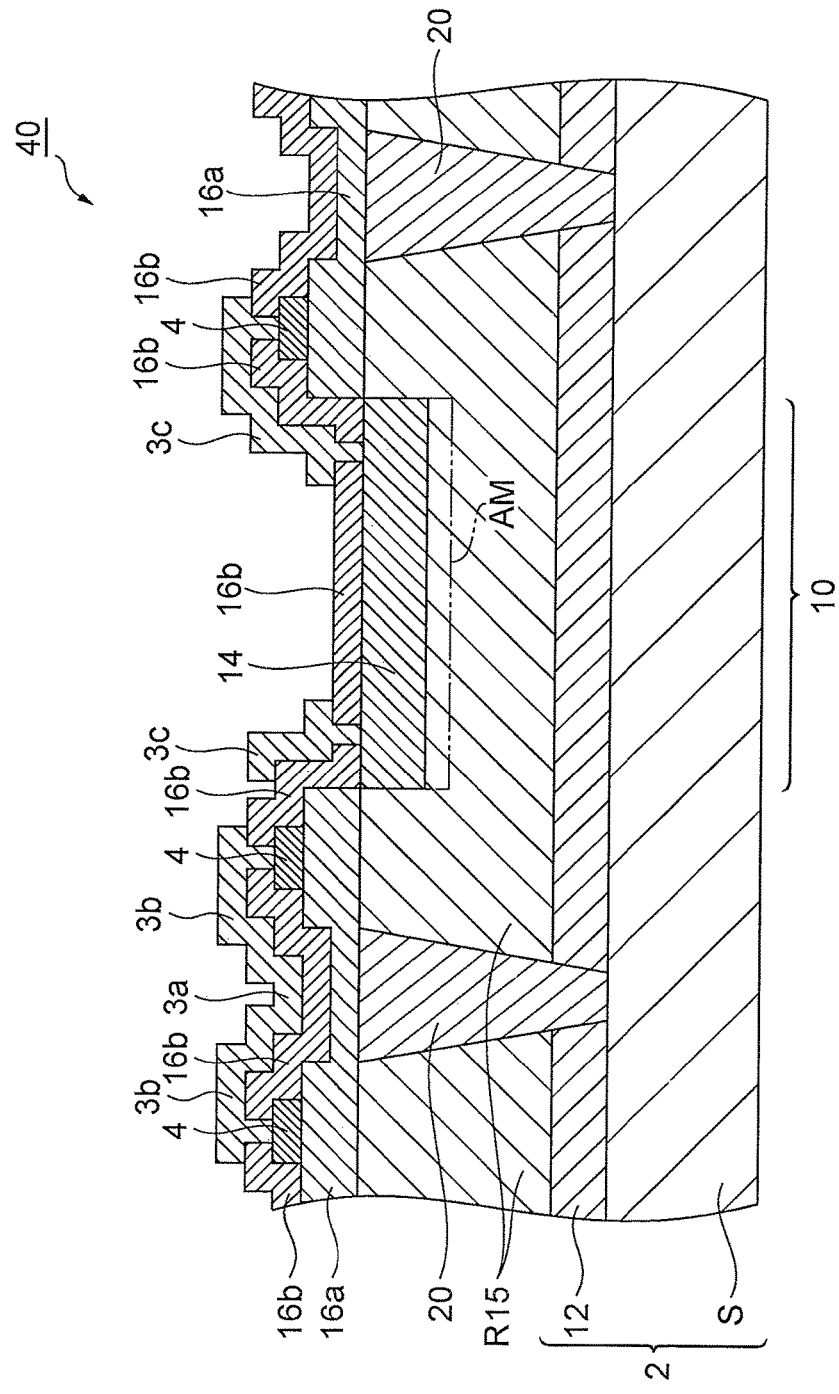
FIG. 13 is a cross sectional view showing a photodiode array according to a modification of the layer structure of the embodiment shown in FIG. 7.
Figure 14:
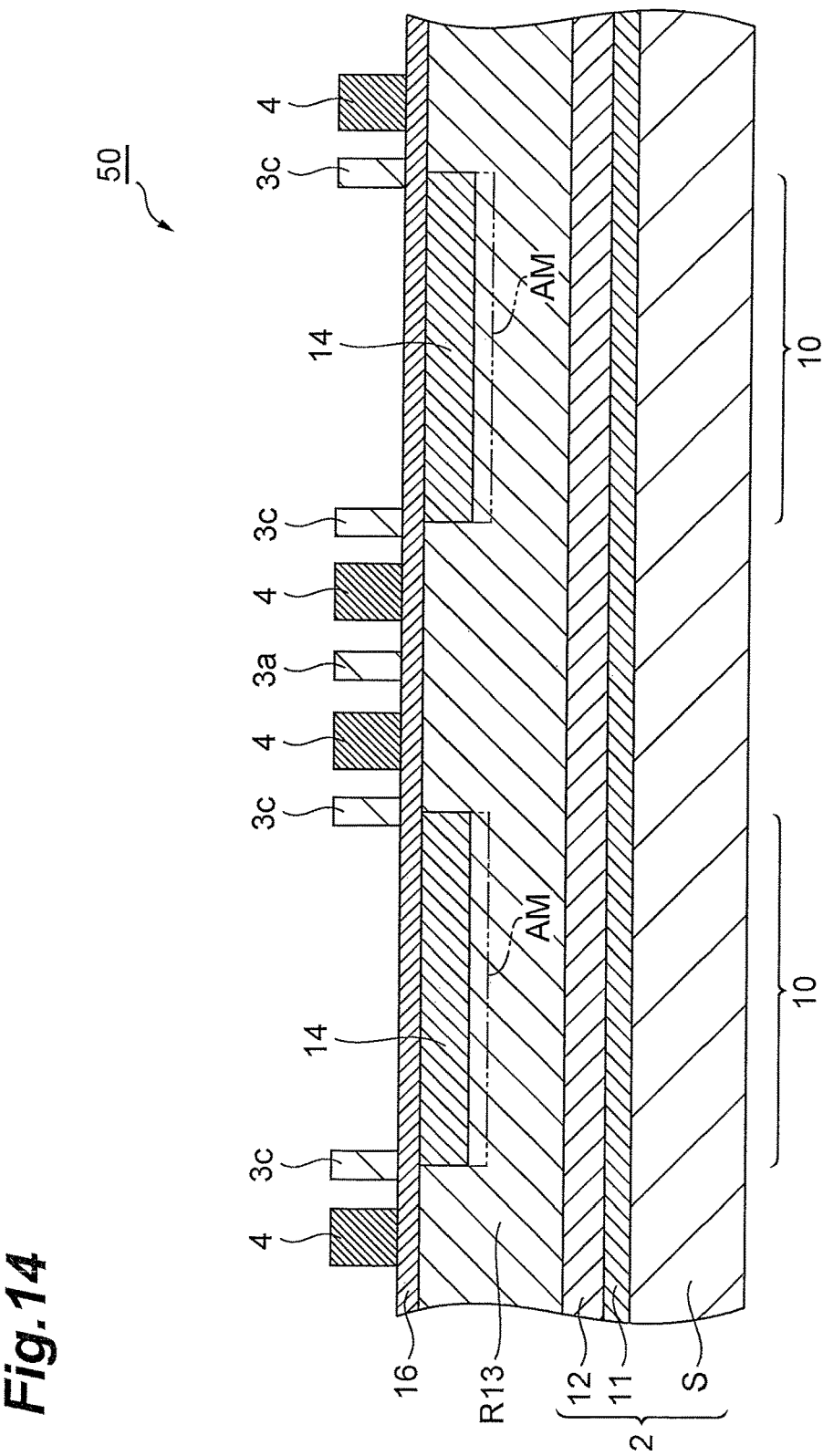
FIG. 14 is a cross sectional view showing a photodiode array according to a modification of the layer structure of the embodiment shown in FIG. 8.

FIG. 9 is a cross sectional view showing a photodiode array according to a modification of the layer structure of the embodiment shown in FIG. 2; FIG. 10 is a cross sectional view showing a photodiode array according to a modification of the layer structure of the embodiment shown in FIG. 4; FIG. 11 is a cross sectional view showing a photodiode array according to a modification of the layer structure of the embodiment shown in FIG. 5; FIG. 12 is a cross sectional view showing a photodiode array according to a modification of the layer structure of the embodiment shown in FIG. 6; FIG. 13 is a cross sectional view showing a photodiode array according to a modification of the layer structure of the embodiment shown in FIG. 7; and FIG. 14 is a cross sectional view showing a photodiode array according to a modification of the layer structure of the embodiment shown in FIG. 8. These photodiode arrays have the same basic flat plane configuration and connections as those shown in FIG. 1.

As described above, in the structure shown in FIGS. 9 to 14, instead of the p-type semiconductor layer 13 or p-type semiconductor layer 15 of FIG. 2, FIG. 4, FIG. 5, FIG. 6, FIG. 7, and FIG. 8, an n-type semiconductor layer R13 or R15 is used. In the case, a pn junction is formed at the interface between the n-type semiconductor layer R13 (or R15) having a low concentration and the p-type semiconductor layer 14, and a depletion layer extends from the pn junction toward the n-type semiconductor layer R13 (or R15), and a multiplication region AM corresponding to the depletion layer is formed from the pn junction interface toward the n-type semiconductor layer R13 (or R15). The other structures and operations are the same as those described above.

These photodiode array 1 is configured with the plurality of photodetector channels 10 which are formed on the n-type substrate 2 having the n-type semiconductor layer 12 thereon, with a light to be detected being incident to the photodetector channels 10. The photodiode array in which a plurality of photodetector channels 10 are formed on a substrate having a semiconductor layer 12 (S) of n+-type which is a first conductivity type, with a light to be detected being incident to the plurality of photodetector channels 10, comprises the substrate 2; the epitaxial semiconductor layer R13 (or R15) of n−-type, a first conductivity type, which is formed on the first conductivity type semiconductor layer 12 of the substrate. 2 and has a plurality of multiplication regions AM for avalanche multiplication of carriers produced by the incidence of the light to be detected so that each of the multiplication regions AM corresponds to each of the photodetector channels 10; a diffusion region 14 of P+-type which is a second conductivity type, the region being formed in the epitaxial semiconductor layer R13 (or R15) of the first conductivity type and forms a pn junction at the interface with the epitaxial semiconductor layer R13 (or R15); and a plurality of resistors 4 each of which has two ends and is provided for each photodetector channel 10 so as to be electrically connected to the diffusion region 14 of the second conductivity type in the epitaxial semiconductor layer R13 (or R15) via one end 4a thereof, and be connected to the signal conductor 3 via the other end 4b thereof.

Each of the resistors 4 is, as shown in FIG. 1, provided for each photodetector channel 10 via one end 4a thereof and the channel surrounding part 3c, and is connected to the reading part 3a via the other end 4b thereof and the connecting part 3b. The plurality of resistors 4 connected to a common reading part 3a are connected to the reading part 3a.

In these photodiode arrays, a pn junction is formed with the epitaxial semiconductor layer R13 (or R15) of the first conductivity type on the substrate and the epitaxial semiconductor layer 14 of the second conductivity type formed in the epitaxial semiconductor layer R13 (or R15). A multiplication region AM is formed in the epitaxial semiconductor layer R13 (or R15) by which a pn junction is attained, and the multiplication region AM corresponding to each photodetector channel is positioned in the epitaxial semiconductor layer R13 (or R15). Therefore, the above photodiode array does not have any end (edge) of a pn junction where edge breakdown is caused when the photodiode array is caused to be operated in Geiger mode, and does not have to be provided with a guard ring. This allows the above photodiode array to have a high ratio of opening area.

Figure 15:
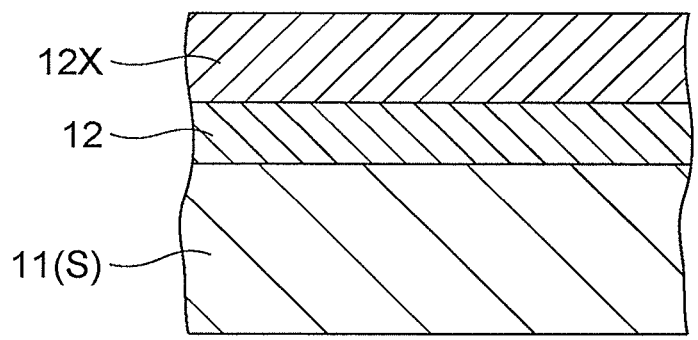
FIG. 15 is a cross sectional view showing the part around a semiconductor layer 12.

FIG. 15 is a cross sectional view showing a buffer layer 12X which is provided on the semiconductor layer 12. The buffer layer 12X is composed of an n-type semiconductor layer. On the n-type semiconductor layer 12, a buffer layer 12X composed of an n-type semiconductor may be used. Alternatively, on the n-type semiconductor layer 12, a buffer layer 12X composed of a p-type semiconductor may be used. In the case, a pn junction is formed between the n-type semiconductor layer 12 and the p-type buffer layer 12X, and a multiplication region AM is formed in the p-type buffer layer 12X. Moreover, in the case without the insulator 11 of the third embodiment, a p-type semiconductor layer may be used instead of the n-type semiconductor layer 12, and a buffer layer composed of p-type semiconductor may be used on the p-type semiconductor layer. In the case, a pn junction is formed between the p-type semiconductor layer and the $n^+$-type substrate member S (substrate 2), and a multiplication region AM is formed in the p-type semiconductor layer.

INDUSTRIAL APPLICABILITY

The present invention can be used as a photodiode array having a high ratio of opening area to a light to be detected.

The invention claimed is:

1. An avalanche photodiode array comprising a plurality of avalanche photodiodes operating under Geiger mode, the avalanche photodiode array comprising:
    a substrate comprising the avalanche photodiodes;
    an insulator formed on the substrate;
    a plurality of signal conductors provided on the insulator;
    a plurality of resistors disposed so as to correspond to respective signal conductors, connecting the respective avalanche photodiodes and the signal conductors, and provided on a light incident side of the substrate via the insulator; and
    photodetector channels of the avalanche photodiodes are arranged in a matrix,
    wherein the signal conductors comprise:
    a first signal conductor; and
    a second signal conductor,
wherein
    the first signal conductor is positioned between neighboring photodetector channels, connected to these photodetector channels,
    the second signal conductor is positioned between neighboring photodetector channels, connected to these photodetector channels; and
    the first and second signal conductors are connected to an electrode arranged outside a region where the photodetector channels are formed.

2. An avalanche photodiode array according to claim 1, wherein the substrate comprises:
    a substrate member; and
    another insulator for suppressing afterpulses, provided between the substrate member and a pn junction of the avalanche photodiode.

* * * * *